United States Patent
Adachi

(10) Patent No.: US 8,344,769 B2
(45) Date of Patent: Jan. 1, 2013

(54) JITTER SUPPRESSION CIRCUIT AND JITTER SUPPRESSION METHOD

(75) Inventor: Takahiro Adachi, Tokyo (JP)

(73) Assignee: NEC Corporation, Tokyo (JP)

( * ) Notice: Subject to any disclaimer, the term of this patent is extended or adjusted under 35 U.S.C. 154(b) by 107 days.

(21) Appl. No.: 12/672,619

(22) PCT Filed: Sep. 4, 2008

(86) PCT No.: PCT/JP2008/066001
§ 371 (c)(1),
(2), (4) Date: Feb. 8, 2010

(87) PCT Pub. No.: WO2009/034917
PCT Pub. Date: Mar. 19, 2009

(65) Prior Publication Data
US 2011/0193602 A1    Aug. 11, 2011

(30) Foreign Application Priority Data

Sep. 12, 2007 (JP) ................................. 2007-236563

(51) Int. Cl.
*H03L 7/06* (2006.01)
(52) U.S. Cl. ........................................ 327/156; 327/147
(58) Field of Classification Search .................. 327/147, 327/151, 156
See application file for complete search history.

(56) References Cited

U.S. PATENT DOCUMENTS

| | | | | |
|---|---|---|---|---|
| 5,053,863 A | * | 10/1991 | Ohtsuka | 348/717 |
| 5,497,126 A | | 3/1996 | Kosiec et al. | |
| 6,538,518 B1 | * | 3/2003 | Chengson | 331/17 |
| 6,650,721 B1 | * | 11/2003 | Janesch et al. | 375/376 |
| 7,304,498 B2 | * | 12/2007 | Bereza et al. | 326/38 |
| 7,366,270 B2 | * | 4/2008 | Tang et al. | 375/372 |
| 7,369,069 B2 | * | 5/2008 | Usugi et al. | 341/100 |
| 7,656,323 B2 | * | 2/2010 | Bereza et al. | 341/100 |

FOREIGN PATENT DOCUMENTS

RU      2127485 C1    3/1999

OTHER PUBLICATIONS

International Search Report for PCT/JP2008/066001 mailed Nov. 4, 2008.
Russian Office Action for RU201011428/08(020102) mailed on Aug. 21, 2012.

* cited by examiner

*Primary Examiner* — Hai L Nguyen

(57) ABSTRACT

There is provided a jitter suppression circuit and a jitter suppression method in which both shortening of a pull-in time and high jitter suppression characteristics is satisfied. In a jitter suppression circuit using a digital phase locked loop, both shortening of a pull-in time and high jitter suppression effect can be satisfied by determining whether the loop is in a synchronous state or not using a phase difference between an input clock and an output clock, and changing characteristics of a loop filter by the determination result.

1 Claim, 14 Drawing Sheets

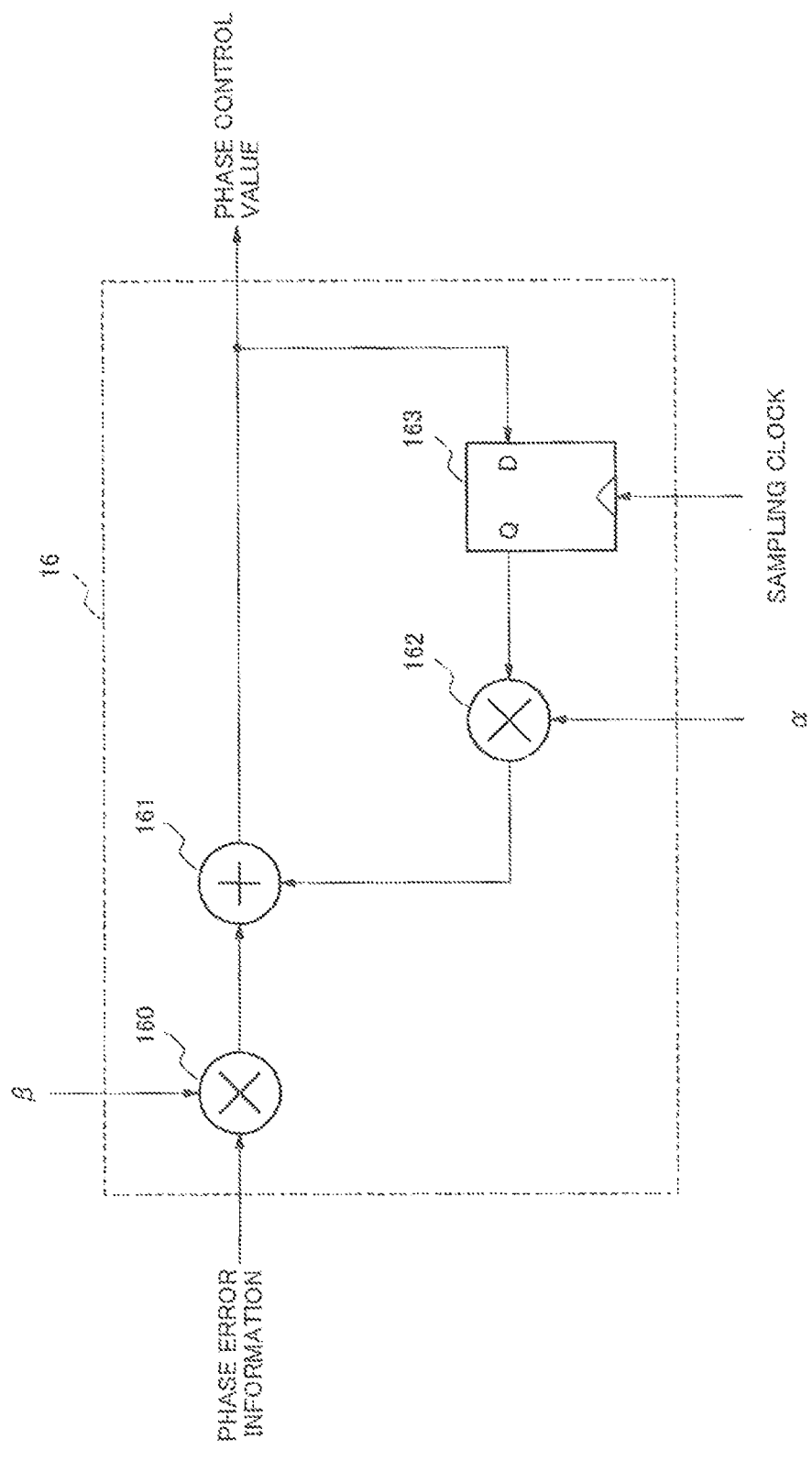

US 8,344,769 B2

JITTER SUPPRESSION CIRCUIT AND JITTER SUPPRESSION METHOD

TECHNICAL FIELD

The present invention relates to a jitter suppression circuit and a jitter suppression method.

BACKGROUND ART

In a digital transmission network, a pulse stuffing method is used for multiplexing asynchronous signals. In a pulse stuffing method, destuffing processing is needed in a receiving end. Because a signal for which destuffing processing has been performed has a large jitter, this jitter needs to be suppressed.

Conventionally, as a suppression means of a destuffing jitter, as disclosed in patent document 1, a method using a memory and a digital phase locked loop (DPLL) has been formulated. In this method, a jitter included in input clock and input data can be suppressed by writing the input data in a memory once, reading the data from the memory using an output clock with less jitter, and then outputting it. Frequency synchronization is maintained between the input clock and the output clock by a DPLL so that the data discontinuity by the overflow or underflow of the memory does not occur.

Generally in a PLL (Phase Locked Loop), in order to make a pull-in time short, the loop bandwidth needs to be expanded. On the one hand, in order to suppress a jitter component of an input signal, the loop bandwidth needs to be narrowed so that the output clock does not follow the jitter of then input clock. The loop bandwidth is determined by the bandwidth of a loop filter mainly.

Accordingly, in a conventional jitter suppression circuit, in order to achieve a high jitter suppression effect, the bandwidth of the loop filter needs to be narrowed, and as a result, there is a problem that a pull-in time becomes long.

Also in a PLL, as disclosed in patent document 2, for the purpose of shortening a pull-in time and of improving stability when synchronized, a means to detect whether a phase difference between an input signal and an output signal is no smaller than a predetermined value or not, and change a parameter of a loop filter according to the detection result is being proposed.

Because a PLL is generally used to make an output signal phase-locked to an input signal, a phase error between the input signal and the output signal is small when they are in a synchronous state. Accordingly, the means to perform parameter change according to whether a phase error is no smaller than a predetermined value is effective in shortening a pull-in time and improving stability at the time of synchronization.

Additionally, as a related art, patent documents 3-7 are cited, for example.

[Patent document 1] Japanese Patent Application Laid-Open No. 1992-246939
[Patent document 2] Japanese Patent Application Laid-Open No. 1997-200049
[Patent document 3] Japanese Patent Application Laid-Open No. 2000-031953
[Patent document 4] Japanese Patent Application Laid-Open No. 2003-023353
[Patent document 5] Japanese Patent Application Laid-Open No. 2007-036366
[Patent document 6] Japanese Patent Application Laid-Open No. 1993-327782
[Patent document 7] Japanese Patent Application Laid-Open No. 1994-053821

DISCLOSURE OF INVENTION

Problem(s) to be Solved by the Invention

However, in a PLL in a jitter suppression circuit, an input clock has a large jitter component, and thus it is necessary that an output clock does not follow a jitter component. Accordingly, even in a synchronous state, there may be a case when a phase difference between an input clock and an output clock becomes a large value momentarily. So, when the above-mentioned method is applied just as it is, as a result of mis-determination that it is in the asynchronous state when it is, in reality, in a synchronous state, an unnecessary change of a parameter occurs, and the jitter suppression characteristics degrades. Therefore, there is a problem that it is difficult to satisfy both of shortening of a pull-in time and high jitter suppression characteristics.

Accordingly, the object of the present invention is to provide a jitter suppression circuit and a jitter suppression method which satisfy both of shortening of a pull-in time and high jitter suppression characteristics.

Means for Settling the Problem

A first circuit of the present invention is, in a jitter suppression circuit using a digital phase locked loop, characterized in that shortening of a pull-in time and suppression of a jitter is achieved by determining whether the loop is in a synchronous state from a phase difference between an input clock and an output clock, and then changing characteristics of a loop filter according to the determination result.

A second circuit of the present invention is characterized in that, in addition to the aforementioned constitution, it comprises: a clock transferring part which performs retiming of an input data; and a digital phase locked loop which suppresses a jitter of an output data of the clock transferring part and an output clock by changing characteristics of a loop filter according to a determination result of whether the loop is in a synchronous state or not.

A third circuit of the present invention is characterized in that, in addition to aforementioned constitution, the clock transferring part comprises: a serial/parallel converting circuit which performs serial-to-parallel conversion of input data; a flip-flop circuit which changes timing of parallel data from the serial/parallel converting circuit; and a parallel/serial converting circuit which performs parallel-to-serial conversion of data from the flip-flop circuit, wherein the digital phase locked loop comprises: a phase comparator which compares a phase difference between an input clock of the clock transferring part and an output clock; a numerical control oscillator which supplies a clock signal to the flip-flop circuit and the parallel/serial converting circuit; a loop filter inserted between the phase comparator and the numerical control oscillator; and a parameter selection circuit which selects and changes a parameter of the loop filter according to output of the phase comparator.

A fourth circuit of the present invention is characterized in that, in addition to aforementioned constitution, the above-mentioned phase comparator comprises: an input-side rising edge detection circuit which detects a rising edge of an input-side phase comparison signal which is generated by dividing the input clock; an output-side rising edge detection circuit which detects a rising edge of an output-side phase comparison signal which is generated by dividing the output signal; a counter which detects a phase difference by counting a period from a rising edge of the input-side phase comparison signal to a rising edge of the output-side phase comparison signal by a sampling clock.

A first method of the present invention is, in a jitter suppression method using a digital phase locked loop, characterized in that shortening of a pull-in time and suppression of a jitter is achieved by determining whether the loop is in a synchronous state or not from a phase difference between an input clock and an output clock, and changing characteristics of a loop filter according to the determination result.

The second method of the present invention is characterized in that, in addition to aforementioned constitution, a jitter of output data of said clock transferring part and an output clock is suppressed by performing retiming for an input data by a clock transferring part, and by changing characteristics of a loop filter according to a determination result of whether, in a digital phase locked loop, the loop is in a synchronous state or not.

The Effect of the Invention

According to the present invention, in a jitter suppression circuit using a digital phase locked loop, both of shortening of a pull-in time and a high jitter suppression effect can be satisfied by determining whether the loop is in a synchronous state or not using a phase difference between the input clock and the output clock, and then changing characteristics of a loop filter according to the determination result.

BEST MODE FOR CARRYING OUT THE INVENTION

An embodiment of a jitter suppression circuit according to the present invention is in a jitter suppression circuit using a digital phase locked loop, characterized in that shortening of a pull-in time and suppression of a jitter is achieved by determining whether the loop is in a synchronous state from a phase difference between an input clock and an output clock, and changing characteristics of a loop filter according to the determination result.

According to aforementioned constitution, both shortening of a pull-in time and suppression of a jitter is satisfied by determining whether the loop is in a synchronous state using a phase difference between the input clock and the output clock, and changing characteristics of a loop filter according to the determination result. Because an expensive voltage controlled oscillator and other analog parts are not needed, and integration can be achieved easily, cost can be reduced. In addition, by using a DPLL, it is possible to realize constant jitter suppression characteristics without being influenced by aging changes and temperature changes.

Another embodiment of a jitter suppression circuit according to the present invention is characterized in that it comprises: a clock transferring part by which retiming of an input data is performed; and a digital phase locked loop which suppresses a jitter of an output data of the clock transferring part and an output clock by changing characteristics of a loop filter according to a determination result of whether the loop is in the synchronous state or not.

According to aforementioned constitution, both shortening of a pull-in time and suppression of a jitter is satisfied by determining whether the loop is in a synchronous state using a phase difference between the input clock and the output clock, and changing characteristics of a loop filter according to the determination result. Because an expensive voltage controlled oscillator and other analog parts are not needed, and thus integration can be achieved easily, cost can be reduced. In addition, by using a DPLL, it is possible to realize constant jitter suppression characteristics without being influenced by aging changes and temperature changes.

Yet another embodiment of a jitter suppression circuit according to the present invention is characterized in that, in addition to aforementioned constitution, the clock transferring part comprises: a serial/parallel converting circuit which performs serial-to-parallel conversion of input data; a flip-flop circuit which changes timing of parallel data from the serial/parallel converting circuit; and a parallel/serial converting circuit which performs parallel-to-serial conversion of data from the flip-flop circuit, and the digital phase locked loop comprises: a phase comparator which compares a phase difference between an input clock of the clock transferring part and an output clock; a numerical control oscillator which supplies a clock signal to the flip-flop circuit and the parallel/serial converting circuit; a loop filter inserted between the phase comparator and the numerical control oscillator; and a parameter selection circuit which selects and changes a parameter of the loop filter according to output of the phase comparator.

According to aforementioned constitution, both shortening of a pull-in time and suppression of a jitter is realized by determining whether the loop is in a synchronous state using a phase difference between then input clock and the output clock, and changing characteristics of a loop filter according to the determination result. Because an expensive voltage controlled oscillator and other analog parts are not needed, and thus integration can be achieved easily, cost can be reduced. In addition, by using a DPLL, it is possible to realize constant jitter suppression characteristics without being influenced by aging changes and temperature changes.

The other embodiment of a jitter suppression circuit according to the present invention is characterized in that, in addition to aforementioned constitution, the phase comparator comprises: an input-side rising edge detection circuit which detects a rising edge of an input-side phase comparison signal which is generated by dividing the input clock; an output-side rising edge detection circuit which detects a rising edge of an output-side phase comparison signal which is generated by dividing an output signal; a counter which detects a phase difference by counting a period from a rising edge of the input-side phase comparison signal to a rising edge of the output-side phase comparison signal by a sampling clock.

According to aforementioned constitution, both shortening of a pull-in time and suppression of a jitter is satisfied by determining whether the loop is in a synchronous state using a phase difference between the input clock and the output clock, and changing characteristics of a loop filter according to the determination result. Because an expensive voltage controlled oscillator and other analog parts are not needed, and thus integration can be achieved easily, cost can be reduced. In addition, by using a DPLL, it is possible to realize constant jitter suppression characteristics without being influenced by aging changes and temperature changes.

An embodiment of a jitter suppression method according to the present invention is, in jitter suppression method using a digital phase locked loop, characterized in that shortening of a pull-in time and suppression of a jitter is achieved by determining whether the loop is in a synchronous state from a phase difference between an input clock and an output clock, and changing characteristics of a loop filter according to the determination result.

According to aforementioned constitution, both shortening of a pull-in time and suppression of a jitter is satisfied by determining whether the loop is in a synchronous state using a phase difference between the input clock and the output clock, and changing characteristics of a loop filter according to the determination result. Because an expensive voltage controlled oscillator and other analog parts are not needed, and thus integration can be achieved easily, cost can be reduced. In addition, by using a DPLL, it is possible to realize constant jitter suppression characteristics without being influenced by aging changes and temperature changes.

Another embodiment of a jitter suppression method according to the present invention is characterized in that, in addition to aforementioned constitution, retiming is performed for an input data by the clock transferring part and a jitter of output data of the clock transferring part and the output clock is suppressed by changing, in a digital phase locked loop, characteristics of a loop filter according to the determination result of whether the loop is in a synchronous state.

Further, the embodiments mentioned above indicate an example of the preferred embodiments of the present invention, and various kinds of modified implementation are possible within the range that does not depart from the point of the present invention without being limited to this.

The present invention will be described in detail using an example.

EXAMPLE 1

(Structure of the Example)

FIG. 1 is a block diagram which shows an example of a jitter suppression circuit according to the present invention.

A jitter suppression circuit shown in FIG. 1 includes a clock transferring part 1 and a digital phase locked loop (DPLL) 2 when separated generally.

The clock transferring part 1 includes a serial/parallel converting circuit 4, an input-side timing signal generating circuit 5, an output-side timing signal generating circuit 11, a D flip-flop 10 and a parallel/serial converting circuit 14. The DPLL 2 includes an input-side frequency divider 6, an output-side frequency divider 12, a phase comparator 7, a parameter selection circuit 8, a loop filter 9 and a numerical control oscillator 13. Each component of the clock transferring part 1 and the DPLL 2 will be described below.

First, "clock transferring" means "to change the operation clock of a flip-flop which performs retiming of data." In FIG. 1, although up to the serial/parallel converting circuit 4, the inner D flip-flop 10 is being operated by an input clock, in the D flip-flop 10, it is being operated by an output clock. Accordingly, at the D flip-flop 10, it means that the operation clock is transferred from the input clock to the output clock. Although output data of the D flip-flop 10 is outputted from the parallel/serial converting circuit 14 to outside finally, flip-flops in the parallel/serial converting circuit 14 also operate using the output clock.

The serial/parallel converting circuit 4 converts an input data to parallel data based on a timing signal inputted from the input-side timing signal generating circuit 5.

The input-side frequency divider 6 divides the input clock and outputs its output to the input-side timing signal generating circuit 5 and the phase comparator 7.

In the input-side timing signal generating circuit 5, a timing signal for performing a serial to parallel conversion is generated based on the divided clock inputted from the input-side frequency divider 6 and then supplied to the serial/parallel converting circuit 4.

The phase comparator 7 detects a phase error between a phase comparison signal in the input side and a phase comparison signal in the output side, and outputs phase error information to the parameter selection circuit 8 and the loop filter 9.

The parameter selection circuit 8 obtains the absolute value of the inputted phase error information and compares it with a phase error threshold value set in advance. If the comparison result continues to be no smaller than the phase error threshold value for predetermined forward protection stage count times, it is determined that the loop is in an asynchronous state, and parameter $\alpha 1$ and $\beta 1$ corresponding to a broad-bandwidth are outputted to the loop filter 9.

Here, "continuation for predetermined forward protection stage count times" corresponds to a counter 83 and a comparator 85 of FIG. 4. Although "forward protection" is protection operation when determining a transfer from a synchronous state to an asynchronous state, description will be omitted because operation itself is similar to that of backward protection.

Similarly, when the comparison result continues to be less than the phase error threshold value for backward-protection-step-count times, parameter $\alpha 2$ and $\beta 2$ corresponding to a narrow-bandwidth are outputted.

The loop filter 9 averages phase error information using coefficients $\alpha$ and $\beta$ supplied from the parameter selection circuit 8 and outputs a phase control value. The numerical control oscillator 13 controls the phase of the output clock according to the phase control value supplied from the loop filter 9. The output-side frequency divider 12 divides the output clock and outputs the divided clock to the output-side timing signal generating circuit 11 and the phase comparator 7.

In the output-side timing signal generating circuit 11, a timing signal for taking in output of the serial/parallel converting circuit 4 by the D flip-flop 10 is generated. In the parallel/serial converting circuit 14, parallel data of the D flip-flop 10 output is converted back to serial data, and then outputted to outside.

FIG. 2 is a block diagram showing an example of the serial/parallel converting circuit 4 that is used for a jitter suppression circuit shown in FIG. 1.

As shown in FIG. 2, the serial/parallel converting circuit 4 is realized by combination of a shift register in which D flip-flops 40-42 are connected in series, and D flip-flops 43-46 with an enable terminal which latch the output of the shift register based on a timing signal. The ratio of the serial/parallel conversion is determined by the jitter amount of the input clock and the required suppression quantity. When a jitter of the input clock is large, in order to reserve an enough timing margin, the conversion ratio needs to be made large. FIG. 2 shows an example in which every 4 bits of input data are converted into 4-bits parallel data.

FIG. 3 is a block diagram showing an example of the phase comparator 7 that is used for a jitter suppression circuit shown in FIG. 1.

In FIG. 3, a rising edge detection circuit 70 and a rising edge detection circuit 71 detect a rising edge of an input-side phase comparison signal and an output-side phase comparison signal, respectively, to generate a pulse, and then output it to a counter 72. In the counter 72, the pulses outputted from the rising edge detection circuit 70 and the rising edge detection circuit 71 are used as a count start signal and a count stop signal, respectively. The count stop signal is outputted to the parameter selection circuit 8 as a synchronization determination timing signal after retiming is performed by a D flip-flop 73. The counter 72 performs counting using a sampling clock after a count start signal is inputted until a count stop signal is inputted, and outputs the count value at the time when the count stop signal is inputted.

The sampling clock is a clock which is outputted from an oscillator 3 and has a sufficiently higher frequency than the input/output clock. An adder 74 subtracts a phase offset value set in advance from output of the counter 72 and outputs the result to the parameter selection circuit 8 and the loop filter 9 as phase error information. The phase offset value is a value for specifying a phase difference between the input side and the output side when a loop is in a synchronous state. Usually, a phase offset value is set so that just the center of the data may be taken in when data converted into parallel data is transferred to the output clock. As a result, the margin for the jitter of an input clock is maximized.

FIG. 4 is a block diagram showing an example of the parameter selection circuit 8 that is used for a jitter suppression circuit shown in FIG. 1.

In FIG. 4, an absolute value converter 80 converts phase error information inputted from the phase comparator 7 into an absolute value.

A comparator 81 compares the phase error absolute value and a phase error threshold value (2 in FIG. 4) set in advance and outputs the comparison result to the counter 83 through an inversion gate 82 and to a counter 84.

In the counter 83, counting up is performed by a sampling clock based on a synchronization determination timing signal inputted from the phase comparator 7. When output of the inversion gate 82 is '1', the count value is cleared.

A comparator 85 compares the count value of the counter 83 and a predetermined forward protection stage count (3 in FIG. 4) and inputs the result to the set terminal of a set/reset flip-flop (S/R flip-flop) 87. Similarly, the counter 84 performs counting-up by a sampling clock based on a synchronization determination timing signal.

When output of the comparator 81 is '1', the count value is cleared. In a comparator 86, the count value and a predetermined backward protection stage count (2 in FIG. 4) are compared, and the comparison result is inputted to the reset terminal of the S/R flip-flop 87. In the S/R flip-flop 87, a parameter selection signal is generated according to input from the comparator 85 and the comparator 86, and it is outputted to a selector 88.

In the selector 88, either of coefficient α1 and β1 corresponding to a broad-bandwidth or coefficient α2 and β2 corresponding to a narrow-bandwidth are selected based on the parameter selection signal supplied from the S/R flip-flop 87, and they are outputted to the loop filter 9.

FIG. 5 is a block diagram showing an example of the loop filter 9 that is used for a jitter suppression circuit shown in FIG. 1.

In FIG. 5, phase error information is multiplied by a multiplier 90 and a multiplier 91 with coefficients α and β supplied from the parameter selection circuit 8, respectively. An adder 92 adds output of a D flip-flop 93 and the multiplication result of the phase error information and the coefficient α. The D flip-flop 93 performs accumulated addition of the multiplier 91 output by holding output of the adder 92. An adder 94 adds output of the multiplier 90 and output of the adder 92 and outputs the result to the numerical control oscillator 13 as a phase control value.

FIG. 6 is a block diagram showing an example of the numerical control oscillator 13 that is used for a jitter suppression circuit shown in FIG. 1.

In FIG. 6, an adder 130 adds the inputted phase control value, a frequency offset value set in advance and output of a D flip-flop 132, and outputs the result to a modulo 8 arithmetic unit 131. In the modulo 8 arithmetic unit 131, when a value inputted from the adder 130 is no smaller than 8, the remainder of subtracting just 8 from the input value is outputted. A comparator 133 compares the output value of the modulo 8 arithmetic unit 131 and a threshold value set in advance, and outputs '0' when it is less than the threshold value, and outputs '1' when it is no smaller than the threshold value. A D flip-flop 134 performs retiming for the output of the comparator 133, and supplied it to the D flip-flop 10, the parallel/serial converting circuit 14, the output-side timing signal generating circuit 11 and the output-side frequency divider 12 as an operation clock. Also, it is outputted to outside as an output clock.

FIG. 7 is a block diagram showing an example of the parallel/serial converting circuit 14 that is used for a jitter suppression circuit shown in FIG. 1.

In FIG. 7, a selection signal generation circuit 140 generates a selection signal based on a timing signal inputted from the output-side timing signal generating circuit 11. A selector 141 selects data to be outputted from four input parallel data based on the selection signal inputted from the selection signal generation circuit 140, and outputs it to a D flip-flop 142. In the D flip-flop 142, retiming is performed for the data inputted from the selector 141 by the output clock, and it is outputted to outside.

(Description of Operation of an Example)

Operation of an example of the present invention will be described using FIG. 1.

Input data is inputted with being synchronized with an input clock. It is supposed that, although the input clock includes jitter components, it is of a fixed frequency averagely.

The clock transferring part 1 performs transfer to an output clock which has a little jitter while securing the timing margin for absorbing a jitter by extending duration by converting input data to parallel data. After that, the parallel data is converted back to the original serial data and then it is outputted. Detailed operation of the clock transferring part 1 will be described below using a timing chart of FIG. 8.

FIG. 8 is an example of a timing chart of a jitter suppression circuit shown in FIG. 1.

Input data is inputted to the serial/parallel converting circuit 4 and stored successively in the shift register that includes the D flip-flops 40-42. When a timing signal supplied from the input-side timing signal generating circuit in the input side is '1', input data and each output of the D flip-flops 40-42 is taken into the D flip-flops 43-46 with an enable terminal at a rising edge of the input clock, and converted to parallel data.

When the timing signal inputted from the output-side timing signal generating circuit 11 in the output side is '1', the D flip-flop 10 performs retiming of the parallel data outputted from the serial/parallel converting circuit 4 at a rising edge of the output clock to transfer it to the output clock.

The parallel data transferred to the output clock in the D flip-flop 10 is converted back to the original serial data in the parallel/serial converting circuit 14.

As shown in FIG. 8, the selection signal generation circuit 140 is a counter which counts from 0 to 3, and when an output side timing signal is '1', initializes the count value to 0 at a rising edge of the output clock. In the selector 141, an input data corresponding to an output value of the selection signal generation circuit 140 is selected to be outputted. Retiming is performed for the selector output by the D flip-flop 142 using the output clock, and it is outputted to an external circuit.

An example of a timing chart of the input-side timing signal generating circuit 5 and the output-side timing signal generating circuit 11 which are used for a jitter suppression circuit shown in FIG. 1 is shown in FIG. 9.

In the input-side timing signal generating circuit 5 and the output-side timing signal generating circuit 11, when a ½ frequency-divided clock is '1' and at the same time a ¼ frequency-divided clock is '0', output is made '1' at a rising edge of the clocks. In addition, the input-side frequency divider 6 and an output-side frequency divider 11 output a ¼ frequency-divided clock to the phase comparator 7 as phase comparison signals for the input side and the output side, respectively. In a synchronous state, the DPLL 2 controls the phase of the output clock such that the phase difference between phase comparison signals in the input side and the output side becomes 180 degrees. Accordingly, the phase difference between timing signals in the input side and the output side becomes also 180 degrees, and thus in the D flip-flop 10, the timing margin of the clock transfer can be maximized.

Next, operation of the DPLL 2 will be described.

In the DPLL 2, the input clock and the output clock are divided respectively to generate phase comparison signals, and phase comparison of those is performed. Further, a phase comparison result is averaged and a phase control value is generated, and the phase of the output clock is controlled using the phase control value such that a phase difference between phase comparison signals of the input and output sides becomes 180 degrees. As a result, it is a structure in which, in the clock transferring part 1, a clock is transferred certainly within the timing margin. Detailed operation of the DPLL 2 will be described below using drawings.

The ¼ frequency-divided clocks generated by the input-side frequency divider 6 and the output-side frequency divider 12 are inputted to the phase comparator 7 as a phase comparison signal in the input side and the output side. In the phase comparator 7, the phase error between them is detected, and then supplied to the parameter selection circuit 8 and the loop filter 9 as phase error information.

An example of a timing chart of the phase comparator 7 that is used for a jitter suppression circuit shown in FIG. 1 is shown in FIG. 10.

in the rising, edge detection circuit 70 and the rising edge detection circuit 71, a rising edge is detected by sampling phase comparison signals in the input side and the output side using a sampling clock inputted from the oscillator 3. When an edge is detected, '1' pulse is generated, and outputted to a counter 52. In the counter 52, when a pulse is inputted from a rising edge detection circuit 50, counting is begun, and when a pulse is inputted from a rising edge detection circuit 51, counting is suspended, and the count value is initialized to 0. The count value at the time of input of the pulse is outputted.

In an adder 53, the count value and a phase offset value are added, and the result is outputted to the parameter selection circuit 8 and the loop filter 9 as final phase error information. The phase offset value is a value for specifying a phase difference between the input side and the output side when the loop is in a synchronous state. In the DPLL 2, as a phase error is controlled to be zero, a phase difference in a synchronous state can be set by changing the phase offset value.

In the case shown in FIG. 3, the cycle of the phase comparison signal is 32 sampling clocks. Accordingly, when the phase offset value is set to 16, synchronization can be achieved at the point where the phase difference between the input side and the output side is 180 degrees (a half cycle). Further, the D flip-flop 73 performs retiming of a count stop signal and outputs it to the parameter selection circuit 8 as a synchronization determination timing signal.

As shown in FIG. 10, a synchronization determination timing signal will be '1' at the head of the phase error information. As a result, in the parameter selection circuit 8, the time until phase error information is used for synchronization determination is made minimal.

In the parameter selection circuit 8, synchronization determination of the loop is performed from inputted phase error information, and a parameter to be outputted to the loop filter 9 is changed according to the result.

An example of a timing chart of the parameter selection circuit 8 that is used for a jitter suppression circuit shown in FIG. 1 is shown in FIG. 11.

Operation of the parameter selection circuit 8 will be described using FIGS. 4 and 11.

The absolute value converter 80 converts inputted phase error information into an absolute value and outputs it to the comparator 81. When a phase error absolute value is no smaller than 2, the comparator 81 outputs '1', and when it is less than 2, outputs '0'. When a synchronization determination timing signal inputted from the phase comparator 7 is '1, the counter 83 performs counting up at a rising edge of the sampling clock. At that time, when output of the inversion gate 82 is '1', that is, phase error information is less than 2, the count value is cleared.

When output of the counter 83 is no smaller than 3, the comparator 85 outputs '1', and when it is less than 3, outputs '0'. Similarly, when a synchronization determination timing signal is '1', the counter 84 performs counting up at a rising edge of a sampling clock. In addition, contrary to the counter 83, the count value is cleared when output of the comparator 81 is '1', that is, phase error information is no smaller than 3.

When output of the counter 84 is no smaller than 2, the comparator 86 outputs '1', and when it is less than 2, outputs '0'. When output of the comparator 85 is '1', the S/R flip-flop 87 outputs '1', and when output of the comparator 86 is '1', outputs '0'. When output of the S/R flip-flop 87 is '1', the selector 88 outputs parameters α1 and β1 corresponding to a wideband to the loop filter 9. Further, when output of the S/R flip-flop is '0', parameters α2 and β2 corresponding to a narrow-bandwidth is outputted.

As it has been described above, in the parameter selection circuit 8, when phase error information is no smaller than the phase error threshold value for predetermined forward protection stage count times continuously, it is determined that the loop is in an asynchronous state, and in order to reduce a pull-in time, parameter α1 and β1 for expanding the band of the loop filter 9 are outputted. Conversely, when phase error information is less than the phase error threshold value for predetermined backward protection stage count times continuously, it is determined that the loop is in a synchronous state, and in order to enhance jitter suppression characteristics, parameter α2 and β2 for narrowing the band of the loop filter 9 are outputted.

The loop filter 9 is a digital low pass filter as shown in FIG. 5. As is expressed in the formula 1, its frequency characteristic is decided by α and β. In order to expand a band from the formula (1), the value of α and β should be made large.

$$H(j\omega) = \beta + \alpha/(1-\exp - j\omega) \quad (1)$$

Inputted phase error information is averaged by the loop filter 9, and it is outputted to the numerical control oscillator 13 finally as a phase control value.

Operation of the numerical control oscillator 13 will be described based on FIG. 6 and FIG. 12.

FIG. 12 is an example of a timing chart of the numerical control oscillator 13 shown in FIG. 6.

The adder 130 adds a phase control value inputted from the loop filter 9, a frequency offset value set in advance and output of the D flip-flop 132, and outputs the result to the modulo 8 arithmetic unit 131. The D flip-flop 132 holds the output of the modulo 8 arithmetic unit of one clock before. In the case of a synchronous state, because a phase control value is approximately 0, output of the adder 130 increases by 1 (frequency offset value) in every one clock.

In the modulo 8 arithmetic unit 131, when adder output increases to 8 (the set value of the modulo arithmetic unit), the remainder of subtracting just 8 from the adder output is outputted to the D flip-flop 132 and the comparator 133.

By repeating the above mentioned operation, output of the modulo 8 arithmetic unit repeats numerical values of 0-7.

In the comparator 133, the output of a modulo 8 arithmetic unit and the threshold value set in advance (4 in FIG. 6) is compared, and when it is no smaller than the threshold value, '1' is outputted, and when it is less than the threshold value, '0' is outputted. This threshold value sets a numerical value of ½ of modulo calculation. As a result, in output of the comparator 133, the proportions of '1' and '0' become even. After performing retiming of outputs of the comparator 133, the D flip-flop 134 outputs it to the D flip-flop 10, the output-side timing signal generating circuit 11, the output-side frequency divider 12, the parallel/serial converting circuit 14 and outside as the output clock.

As shown in FIG. 10, when a phase difference between an input-side phase comparison signal and an output-side phase comparison signal is smaller than 180 degrees, a phase control value will be a negative value. As shown in FIG. 12, in the numerical control oscillator 13, when a negative phase control value is inputted, it is controlled so that the phase of the output clock may be delayed. Conversely, when the phase difference is larger than 180 degrees, a phase control value will be a positive value, and it is controlled so that phase lead of the output clock may be achieved. Thus, the DPLL 2 performs control so that a phase difference between an input-side phase comparison signal and an output-side phase comparison signal may be always kept to 180 degrees.

EXAMPLE 2

A block diagram of another example of a jitter suppression circuit according to the present invention is shown in FIG. 13.

In FIG. 13, in the parameter selection circuit 8, output of the loop filter 9 is used as phase error information for synchronization determination. In comparison with the case where output of the phase comparator 7 is used for synchronization determination as is in a jitter suppression circuit shown in FIG. 1, because averaged phase error information is being used, more correct synchronization determination can be performed, although a quick parameter change cannot be performed.

A modified example of the loop filter 9 that is used in a jitter suppression circuit shown in FIG. 1 is shown in FIG. 14.

It is a digital filter with low pass characteristics like the case shown in FIG. 5, and its frequency characteristic is expressed in the formula (2). From the formula (2), it can be found out that, also by using the structure of FIG. 14, a bandwidth is able to be set by changing values of $\alpha$ and $\beta$.

$$H(j\omega)=\beta/(1-\alpha \cdot \exp{-j\omega}) \quad (2)$$

That is, according to the present invention, in a jitter suppression circuit using a digital phase locked loop (DPLL), both shortening of a pull-in time and high jitter suppression effect is satisfied by determining whether the loop is in a synchronous state from a phase difference between an input clock and an output clock, and then changing characteristics of a loop filter according to the determination result.

In FIG. 1, the phase comparator 7 detects a phase error between an input-side phase comparison signal and an output-side phase comparison signal, and outputs phase error information to the parameter selection circuit 8 and the loop filter 9. The parameter selection circuit 8 compares the absolute value of the inputted phase error information and a phase error threshold value set in advance. When the phase error information is no smaller than the phase error threshold value for predetermined forward protection stage count times continuously, it is determined that the loop is in an asynchronous state, and parameters $\alpha 1$ and $\beta 1$ which make the bandwidth of the loop filter 9 wide are outputted.

Also, when it is less than the phase error threshold value for predetermined backward protection stage count times continuously, it is determined that a loop is in a synchronous state and values of coefficients $\alpha 2$ and the $\beta 2$ which make the bandwidth narrow are outputted.

Here, the portions corresponding to "continuation for predetermined backward protection stage count times" are the counter 84 and the comparator 86 of FIG. 4. "Backward protection" is for improving reliability of determination when performing synchronization determination (determination of transition from a asynchronous state to a synchronous state). When described referring to FIG. 4, in the comparator 81, although temporary synchronization determination is performed by whether inputted phase error information is smaller than a phase error threshold value or not, this phase difference error information is not information which can be trusted absolutely (that is, in spite of being in an asynchronous state, there may be a case where phase error information is smaller than a phase error threshold value, and also a case where phase error information is larger than a phase error threshold value.) Accordingly, in the counter 84, counting of the number of times that phase error information is continuously smaller than the phase error threshold value is performed. Then, in the comparator 86, the count value and a predetermined protection stage count value (such as 3 times, for example) are compared, and when it is no smaller than the protection stage count, it is determined for the first time that it is in a synchronous state.

Thus, the jitter suppression effect is improved by shortening a pull-in time by expanding the bandwidth of the loop filter 9 when judgment has been made that the loop is in an asynchronous state, as well as by narrowing the bandwidth of the loop filter 9 when it is determined the loop is in a synchronous state.

Further, the embodiment mentioned above indicates an example of the preferred embodiments of the present invention, and various kinds of modified implementation are possible within the range that does not depart from the point of the present invention without limited to this. For example, in the example mentioned above, although the description has been made using the phase comparator shown in FIG. 3, the present invention is not limited to this, and a phase comparator of an EOR (exclusive logical sum) type may be used.

(Description of the Effect)

As it has been described above, the present invention has the effects indicated bellow.

The first effect is that, in a jitter suppression circuit using a DPLL, both shortening of a pull-in time and high jitter suppression effect can be satisfied by determining whether the loop is in a synchronous state or not from a phase difference between an input clock and an output clock, and then changing characteristics of a loop filter according to the determination result.

The second effect is that, by using a DPLL, an expensive voltage controlled oscillator and other analog parts are not needed, and thus integration can be achieved easily, resulting in cost reduction.

The third effect is that, by using a DPLL, it is possible to realize constant jitter suppression characteristics without being influenced by aging changes and temperature changes.

This application is the National Phase of PCT/JP2008/066001, filed Sep. 4, 2008, which is based upon and claims the benefit of priority from Japanese Patent Application No. 2007-236563, filed on Sep. 12, 2007, the disclosure of which is incorporated herein in its entirety by reference.

INDUSTRIAL APPLICABILITY

The present invention can be used for a digital communication apparatus and digital equipment using a DPLL, and thus it has industrial applicability.

EXPLANATIONS OF LETTERS

Figure 1:
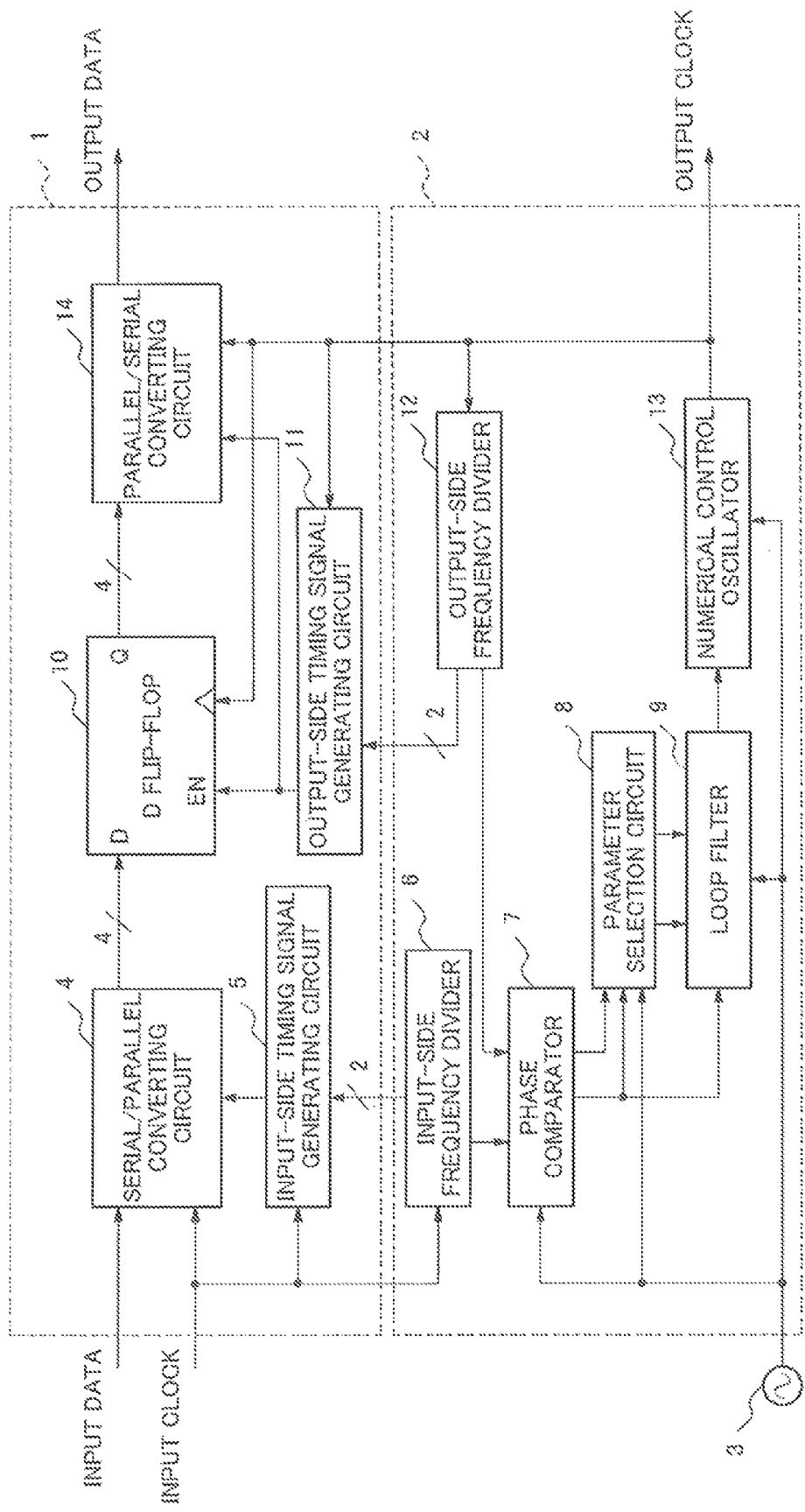
FIG. 1 A block diagram showing an example of a jitter suppression circuit according to the present invention FIG. 2 A block diagram showing an example of the serial/parallel converting circuit 4 that is used for a jitter suppression circuit shown in FIG. 1
Figure 2:
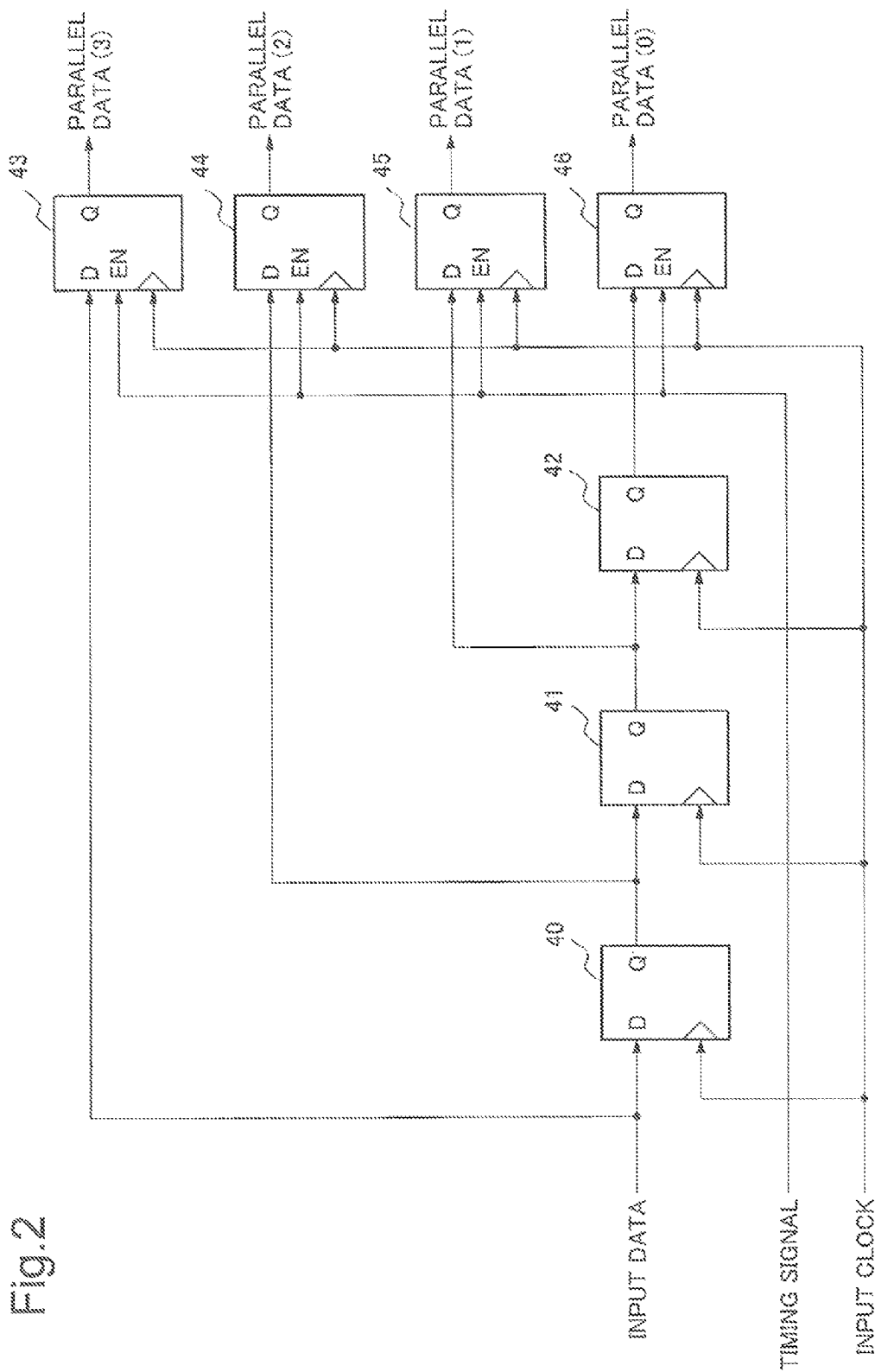
Figure 3:
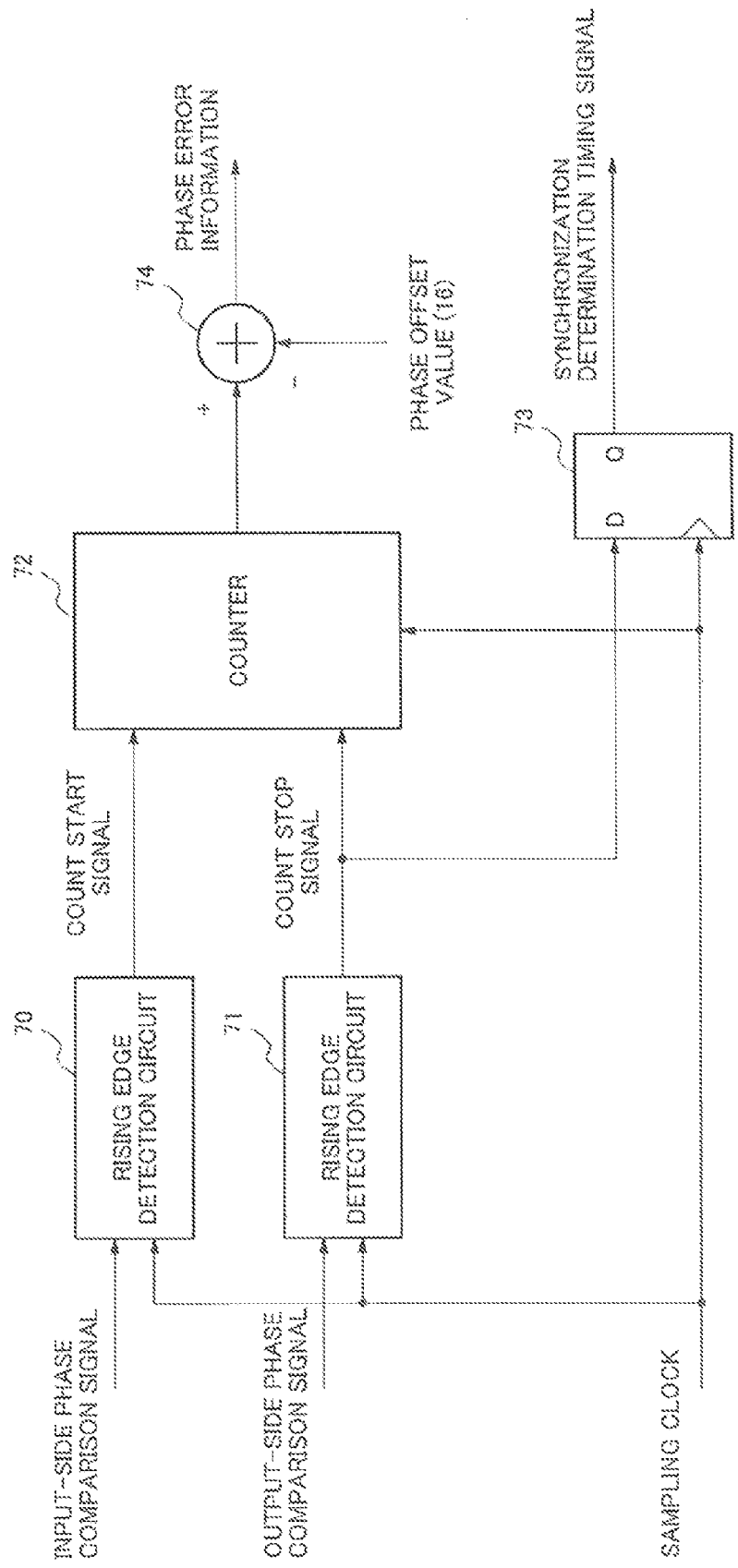
FIG. 3 A block diagram showing an example of the phase comparator 7 that is used for a jitter suppression circuit shown in FIG. 1
Figure 4:
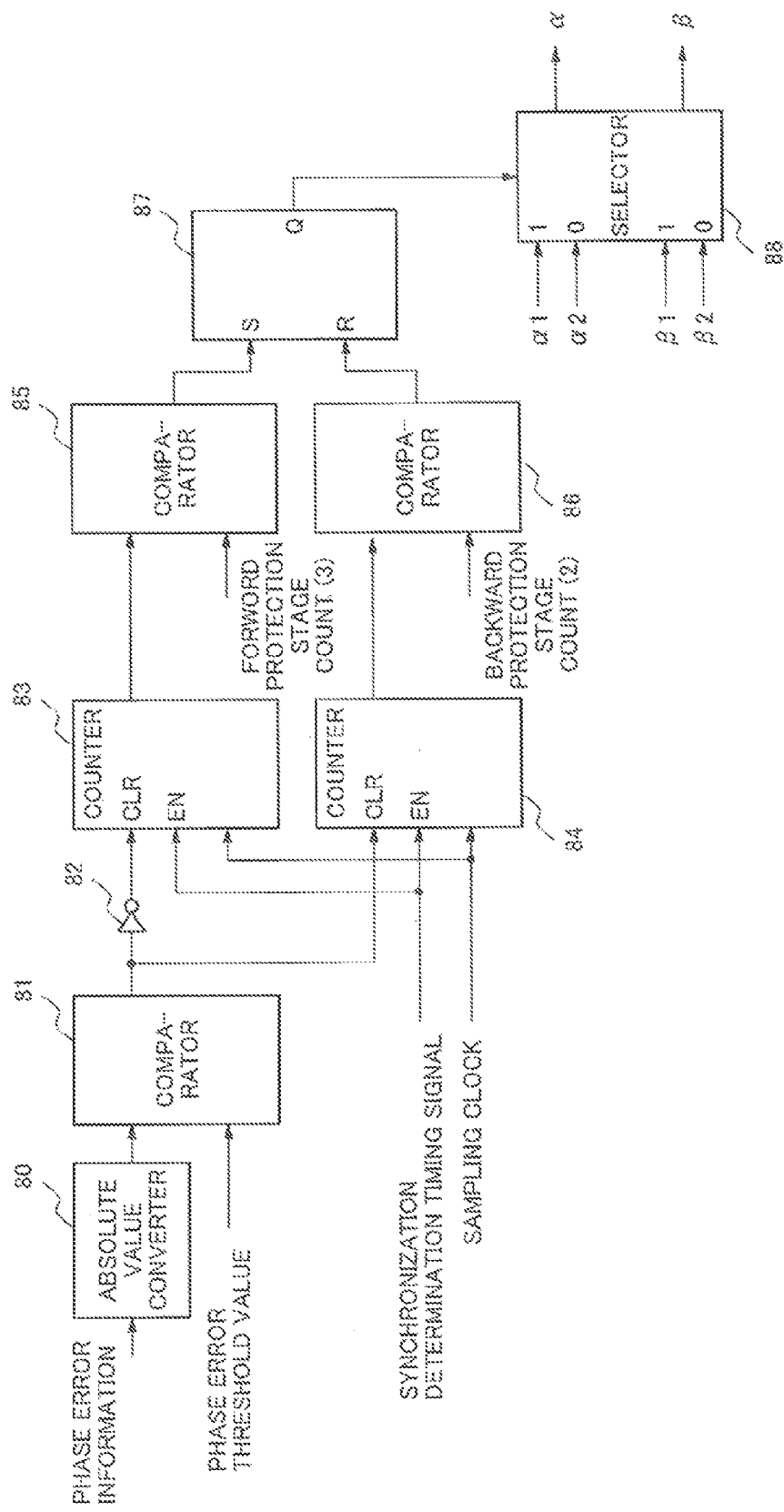
FIG. 4 A block diagram showing an example of the parameter selection circuit 8 that is used for a jitter suppression circuit shown in FIG. 1
Figure 5:
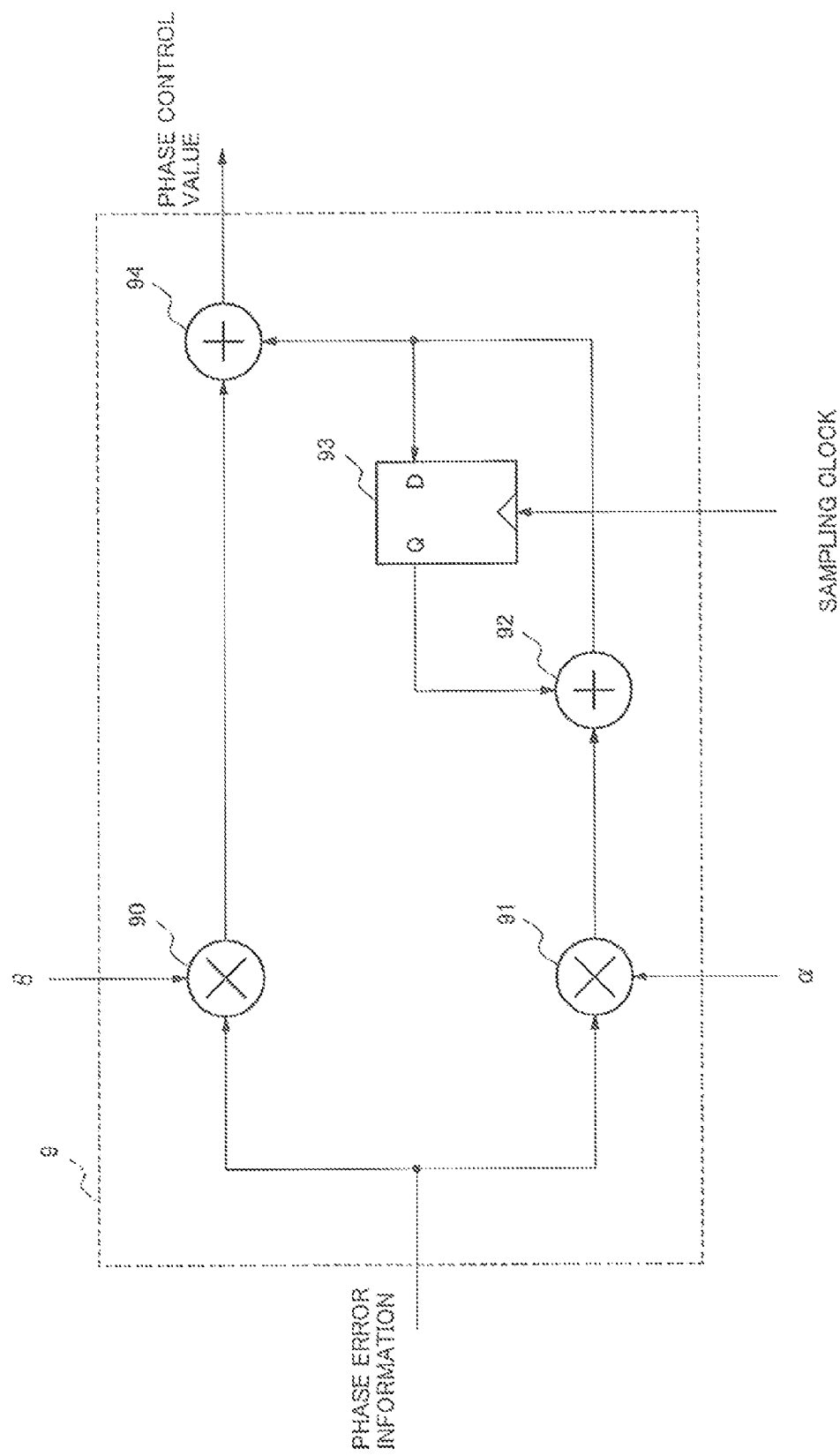
FIG. 5 A block diagram showing an example of the loop filter 9 that is used for a jitter suppression circuit shown in FIG. 1
Figure 6:
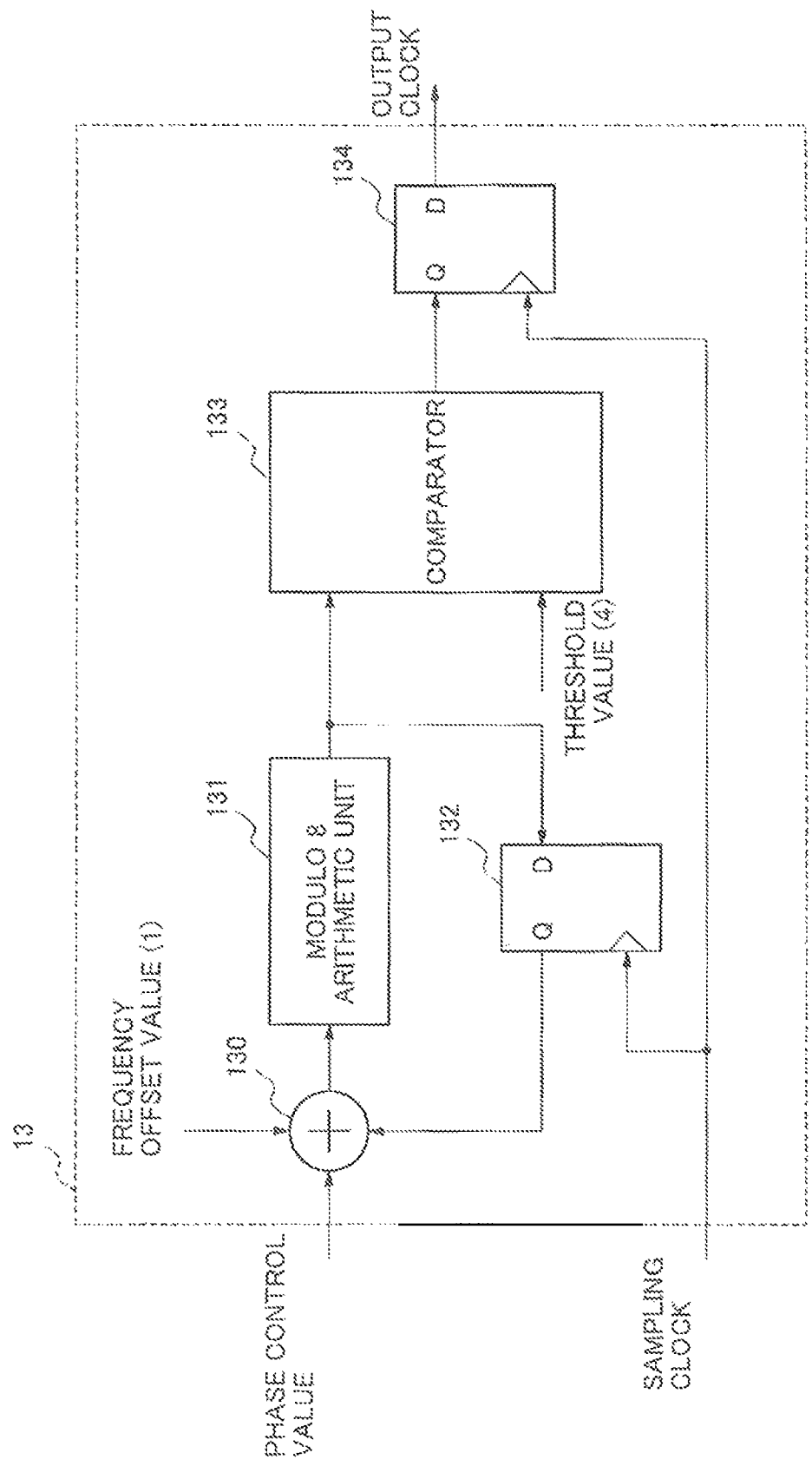
FIG. 6 A block diagram showing an example of the numerical control oscillator 13 that is used for a jitter suppression circuit shown in FIG. 1
Figure 7:
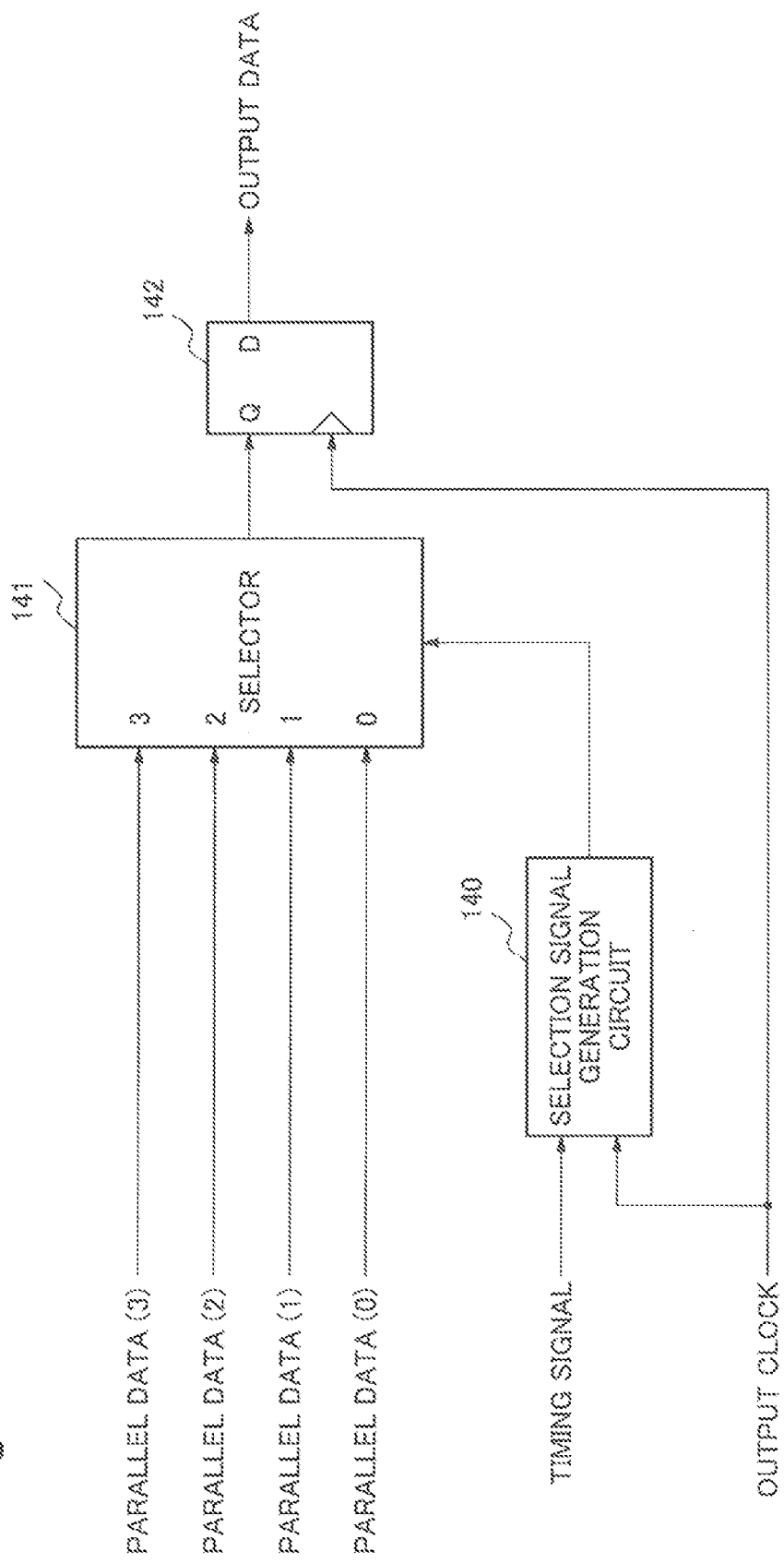
FIG. 7 A block diagram showing an example of the parallel/serial converting circuit 14 that is used for a jitter suppression circuit shown in FIG. 1
Figure 8:
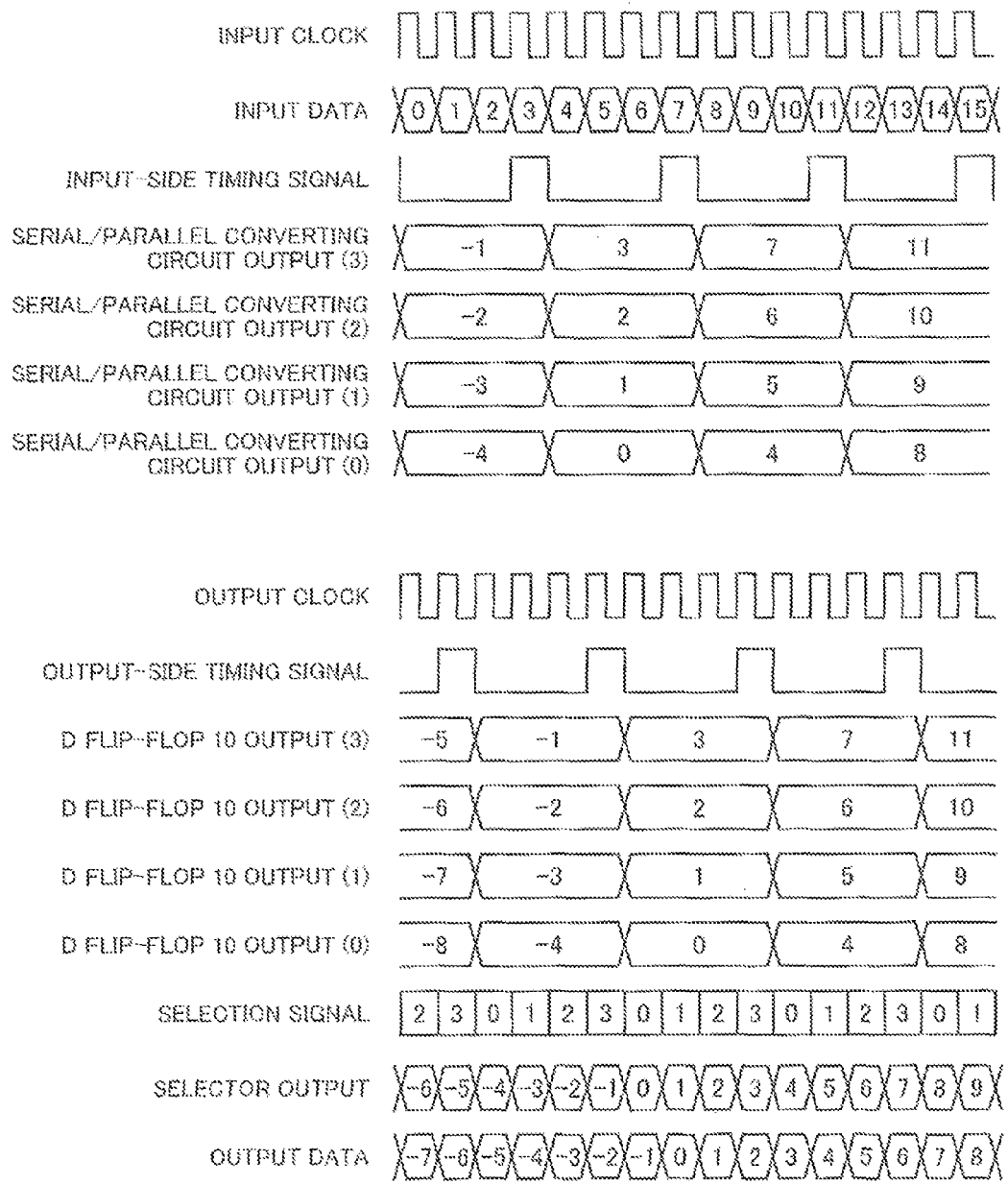
FIG. 8 An example of a timing chart of a jitter suppression circuit shown in FIG. 1
Figure 9:
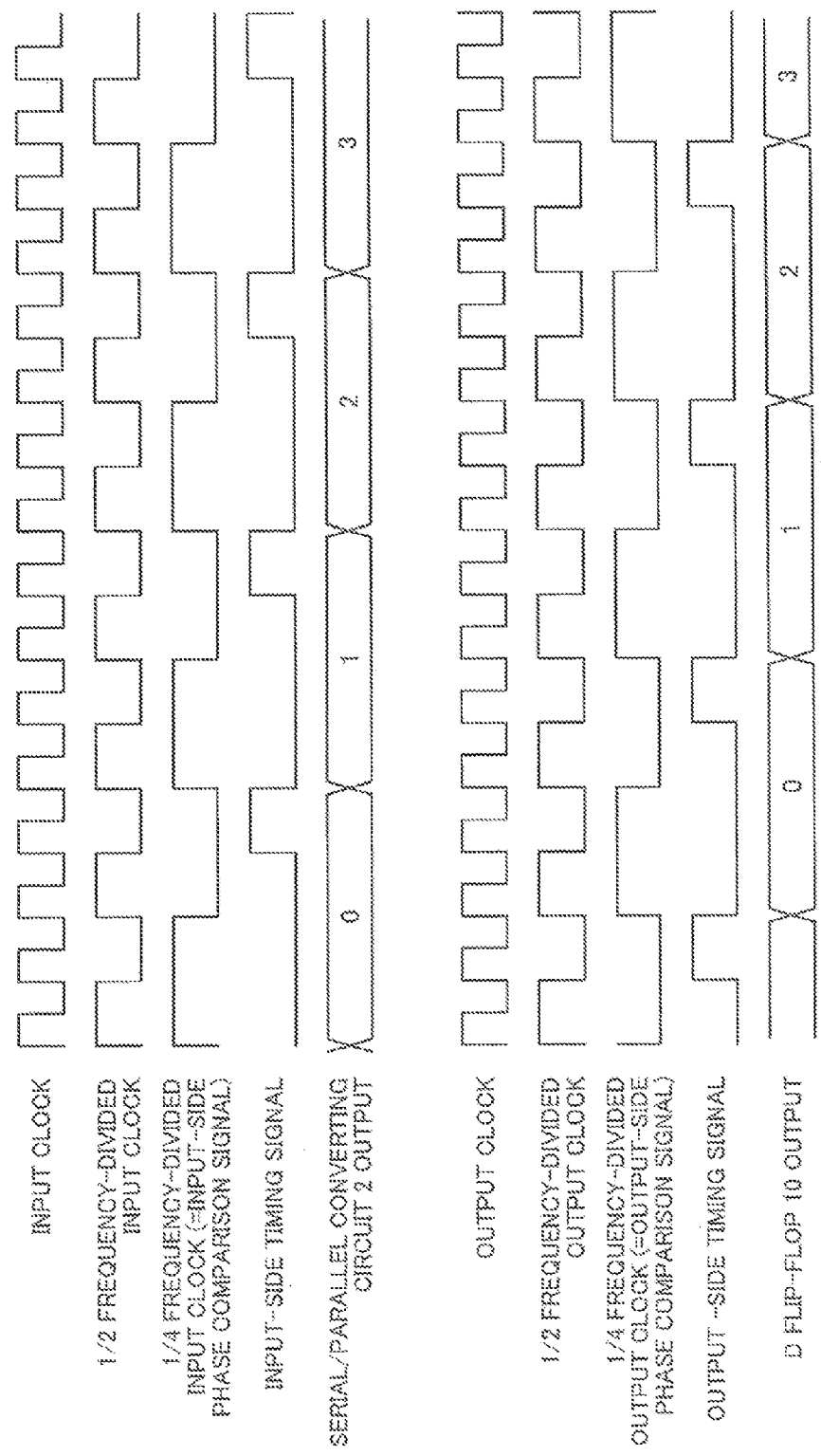
FIG. 9 An example of a timing chart of the input-side timing signal generating circuit 5 and the output-side timing signal generating circuit 11 which are used for a jitter suppression circuit shown in FIG. 1
Figure 10:
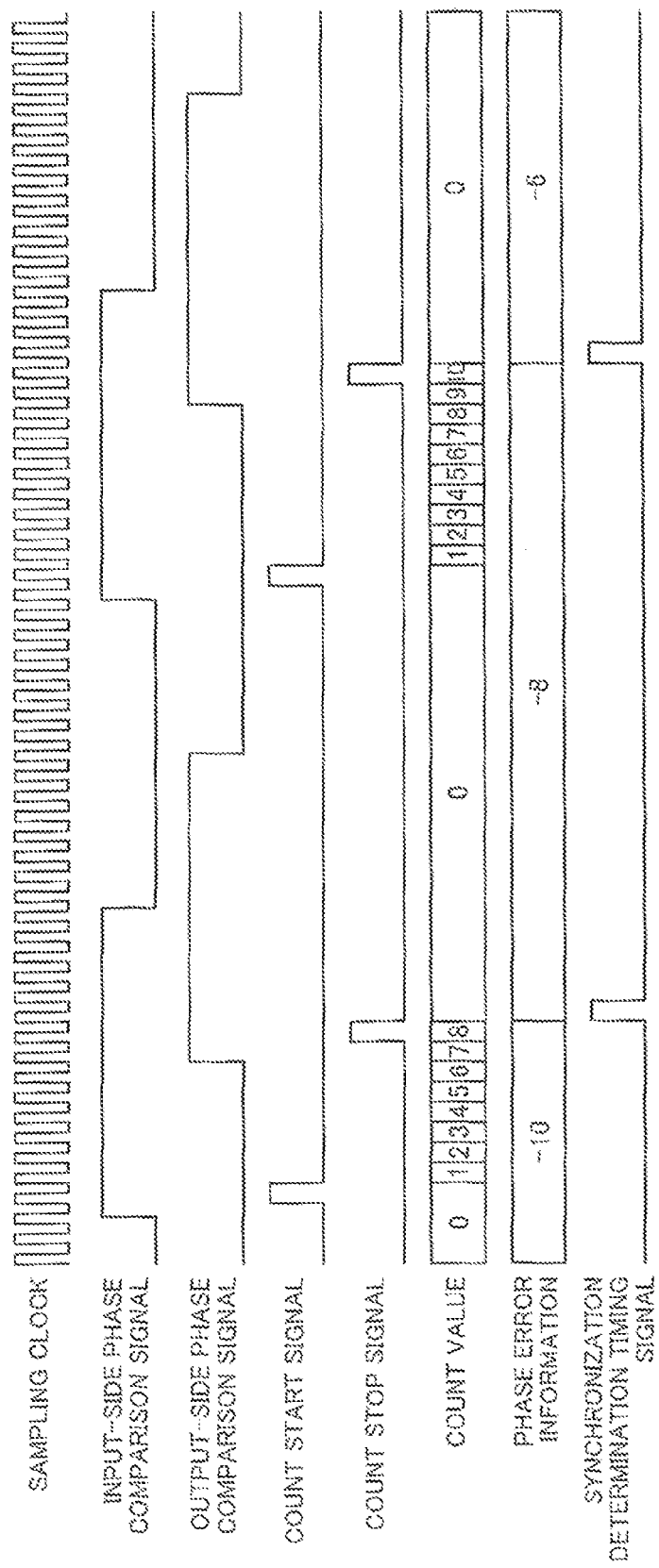
FIG. 10 An example of a timing chart of the phase comparator 7 that is used for a jitter suppression circuit shown in FIG. 1
Figure 11:
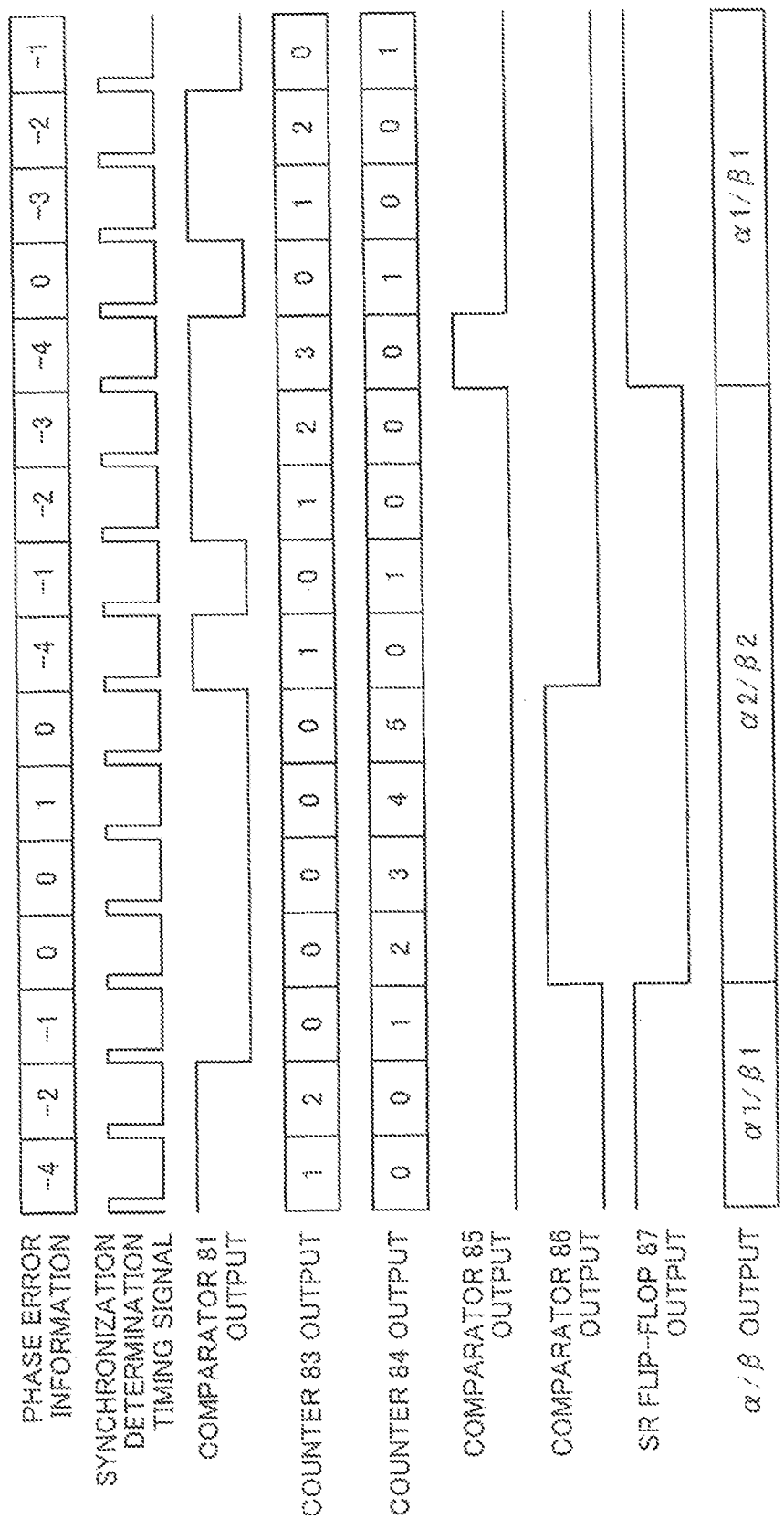
FIG. 11 An example of a timing chart of the parameter selection circuit 8 that is used for a jitter suppression circuit shown in FIG. 1
Figure 12:
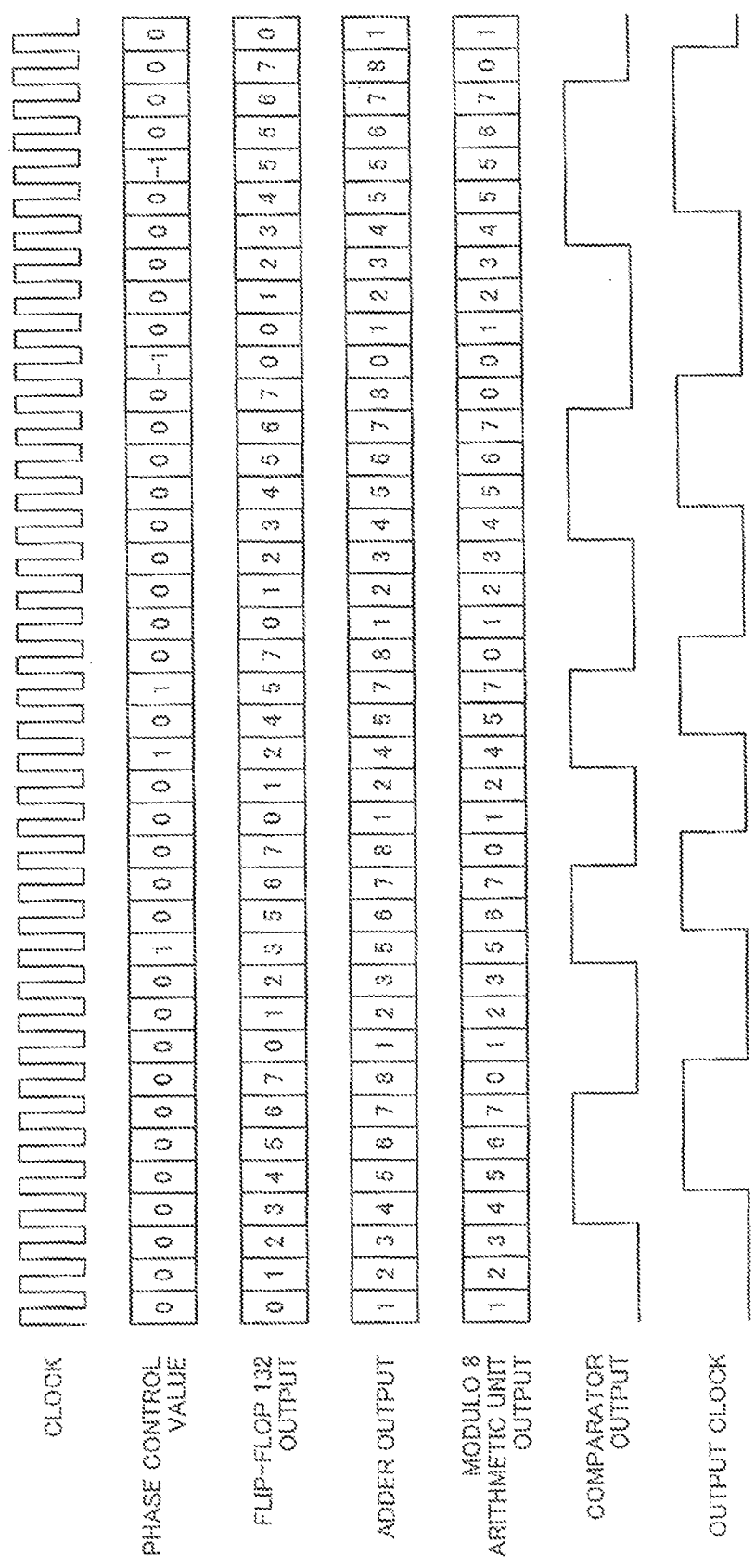
FIG. 12 An example of a timing chart of the numerical control oscillator 13 shown in FIG. 6
Figure 13:
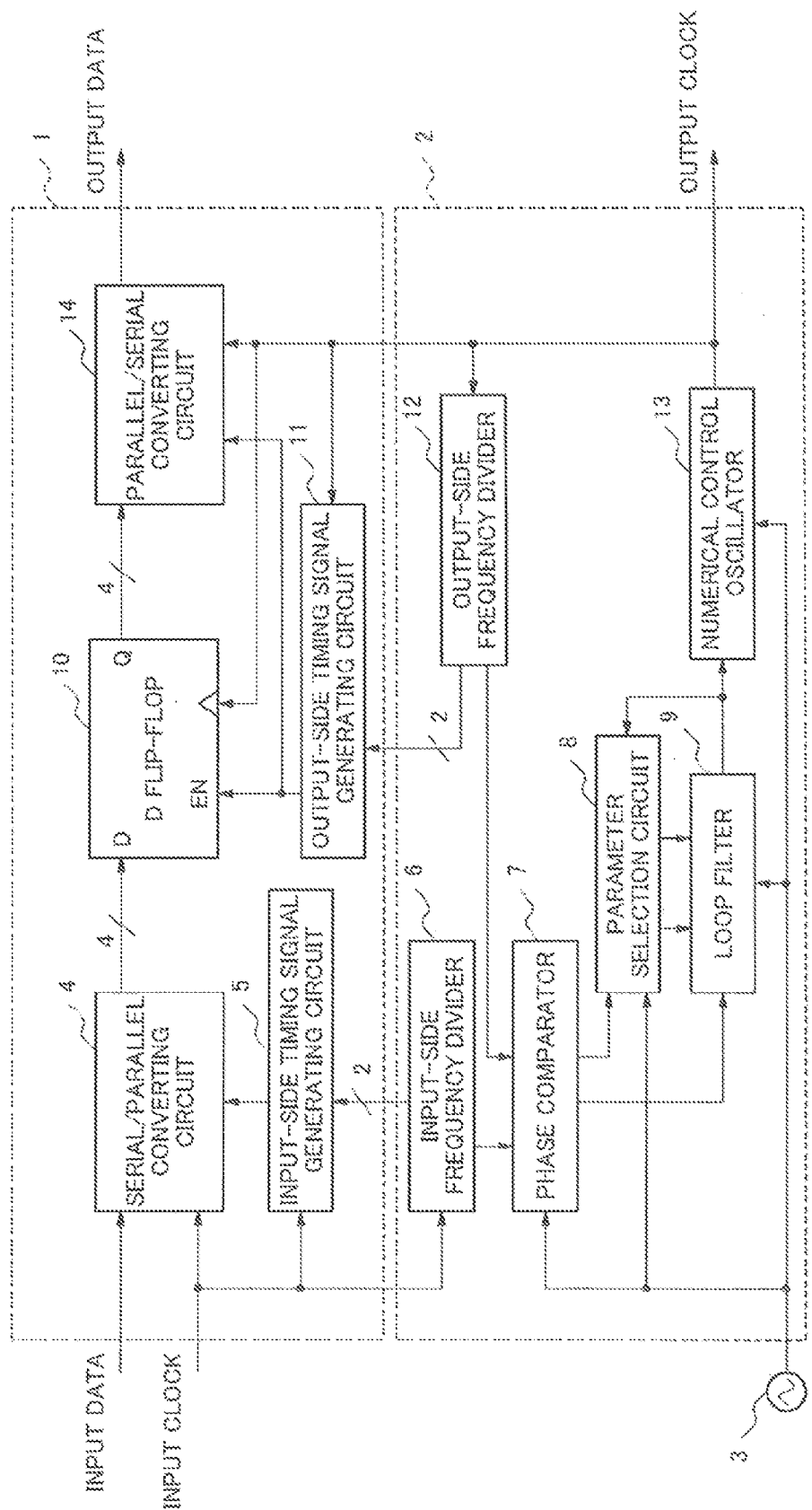
FIG. 13 A block diagram of another example of a jitter suppression circuit according to the present invention FIG. 14 A modification of the loop filter 9 that is used for a jitter suppression circuit shown in FIG. 1

1 Clock transferring part
2 Digital phase locked loop (DPLL)
3 Oscillator
4 Serial/parallel converting circuit
5 Input-side timing signal generating circuit
6 Input-side divider
7 Phase comparator
8 Parameter selection circuit
9 Loop filter
10 D flip-flop
11 Output-side timing signal generating circuit
12 Output-side divider
13 Numerical control oscillator
14 Parallel/serial conversion circuit

The invention claimed is:

1. A jitter suppression circuit using a digital phase locked loop, wherein shortening of a pull-in time and suppression of a jitter is achieved by determining whether the loop is in a synchronous state from a phase difference between an input clock and an output clock, and changing characteristics of a loop filter according to a determination result, wherein a bandwidth of the loop filter is expanded when judgment has been made that the loop is in an asynchronous state, wherein the bandwidth of the loop filter is narrowed when judgment has been made that the loop is in the synchronous state, wherein the jitter suppression circuit comprises:

a clock transferring part by which retiming of an input data is performed; and the digital phase locked loop which suppresses a jitter of an output data of said clock transferring part and the output clock by changing characteristics of the loop filter according to a determination result of whether the loop is in the synchronous state or not, wherein said clock transferring part comprises: a serial/parallel converting circuit which performs serial-to-parallel conversion of input data; a flip-flop circuit which changes timing of parallel data from said serial/parallel converting circuit; and a parallel/serial converting circuit which performs parallel-to-serial conversion of data from said flip-flop circuit, wherein said digital phase locked loop comprises: a phase comparator which compares a phase difference between an input clock of said clock transferring part and the output clock; a numerical control oscillator which supplies a clock signal to said flip-flop circuit and said parallel/serial converting circuit; the loop filter inserted between said phase comparator and said numerical control oscillator; and a parameter selection circuit which selects and changes a parameter of said loop filter according to output of said phase comparator, and wherein said phase comparator comprises: an input-side rising edge detection circuit which detects a rising edge of an input-side phase comparison signal which is generated by dividing said input clock; an output-side rising edge detection circuit which detects a rising edge of an output-side phase comparison signal which is generated by dividing said output signal; a counter which detects a phase difference by counting a period from a rising edge of said input-side phase comparison signal to a rising edge of said output-side phase comparison signal by using a sampling clock.

* * * * *